(12) United States Patent
Oishi et al.

(10) Patent No.: US 6,373,702 B2
(45) Date of Patent: Apr. 16, 2002

(54) COOLING STRUCTURE AND DISPLAY APPARATUS CONTAINING THE COOLING STRUCTURE

(75) Inventors: Toshiharu Oishi; Koichi Kaneko; Daisuke Takao; Sadao Yokoi, all of Shizuoka-ken (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/740,964

(22) Filed: Dec. 21, 2000

(30) Foreign Application Priority Data

Dec. 27, 1999  (JP) .......................................... 11-370363

(51) Int. Cl.⁷ ................................................. H05K 7/20
(52) U.S. Cl. ........................ 361/704; 361/703; 361/707; 361/709; 257/706; 257/712; 257/713; 174/16.3; 165/80.3; 165/185
(58) Field of Search ......................... 361/687, 688–690, 361/697, 703, 704, 707, 709, 717–720; 174/15.1, 16.1, 16.3; 165/80.2, 80.3, 185; 313/582

(56) References Cited

U.S. PATENT DOCUMENTS 5,971,566 A  * 10/1999 Tani et al. .................. 362/294
5,990,618 A  * 11/1999 Morita et al. ................ 313/582
6,198,222 B1 *  3/2001 Chang ........................ 313/582

FOREIGN PATENT DOCUMENTS

| GB | 2138631 A | * 10/1984 |
| JP | 410240138 A | * 9/1998 |
| JP | 411251772 A | * 9/1999 |
| JP | 02000156581 A | * 6/2000 |
| JP | 02000172191 A | * 6/2000 |

* cited by examiner

Primary Examiner—Leo P. Picard
Assistant Examiner—Boris L. Chervinsky
(74) Attorney, Agent, or Firm—Arent Fox Kinter Plotkin & Kahn, PLLC

(57) ABSTRACT

A cooling structure for cooling an exothermic panel such as a plasma display panel by releasing heat therefrom, comprising: a chassis structure for holding the exothermic panel; a plurality of circuit board connecting portions, a plurality of heat radiating fins and a plurality of side frames, which are all integrally formed with the chassis structure on one side thereof. Specifically, at least one sort of the circuit board connecting portions, the heat radiating fins and the side frames are formed in a hollow structure.

7 Claims, 2 Drawing Sheets

COOLING STRUCTURE AND DISPLAY APPARATUS CONTAINING THE COOLING STRUCTURE

BACKGROUND OF THE INVENTION

The present invention relates to a cooling structure and a display apparatus containing the cooling structure. In particular, this invention relates to a heat radiating structure for use with a plasma display apparatus to prevent a temperature rise therein.

A plasma display apparatus comprises a pair of substrate plates (disposed on front and rear sides) which are arranged to face each other with an electric discharge space formed therebetween, a plurality of row electrodes and a plurality of column electrodes which are provided on the inner surface of these substrate plates. The row electrodes are arranged orthogonal to the column electrodes so that a plurality of intersections are formed, thereby forming a plurality of discharge cells.

Since a plasma display apparatus will generate a considerable amount of heat from its surface during its light emission, it is required to be equipped with a cooling structure having a sufficient heat radiating effect.

Usually, the considerable amount of heat is generated from the surface of the rear side substrate plate mounting a power source circuit and a display driving circuit. The heat is then discharged outwardly by means of a cooling fan. However, since the cooling fan requires a relatively large space when it is to be installed within the plasma display, it is difficult to manufacture a plasma display with a small thickness.

In order to solve the above problem, there has been suggested an improved cooling structure shown in FIG. 3 and FIG. 4, which is compact in size but has an increased cooling effect.

As shown in FIG. 3 and FIG. 4, a plasma display apparatus comprises a plasma display panel 1 (hereinafter referred to as PDP) including two glass substrate plates, one of which forms a front substrate plate 1A and the other forms a rear substrate plate 1B. An electrically discharge space is formed between the front and rear substrate plates 1A and 1B. A circuit board 2 mounting a driving circuit is provided on the PDP 1 through a chassis structure 3.

The chassis structure 3 comprises a plurality of longitudinal elongate members 3A and a plurality of lateral elongate members 3B, all of which are made of a metal having a good thermal conductivity, such as an aluminium. The longitudinal elongate members 3A and the lateral elongate members 3B are so arranged that a grillwork structure is formed in a manner as shown in the drawing. Here, the PDP 1 and the circuit board 2 are electrically connected with each other through a flexible cable 4, while the chassis structure 3 and PDP 1 are firmly fixed with each other through a plurality of pressure sensitive adhesive double coated tapes 5.

Here, the chassis structure 3 is formed to provide the PDP 1 with a sufficient strength, and such a strength can be increased by increasing the thickness of the longitudinal and lateral elongate members 3A, 3B. This, however, will undesirably increase the weight of the PDP 1 and also make difficult the assembling operation for producing the grillwork structure.

However, even if the desired strength (for the PDP 1) can be increased by increasing the thickness of the longitudinal and lateral elongated members 3A, 3B, it is difficult to ensure a sufficiently large space for heat radiation.

As a result, the structure shown in FIG. 3 and FIG. 4 not only has a problem of incurring a high cost in the assembling operation for producing the grillwork structure, but also a problem of not being able to obtain a sufficient cooling effect.

SUMMARY OF THE INVENTION

It is an object of the present invention to provide an improved cooling structure and a plasma display containing the improved cooling structure which can provide sufficient strength for supporting the plasma display, reduce the production cost, and obtain a sufficient heat radiating effect, thereby solving the above-mentioned problems peculiar to the above-discussed prior art.

According to the present invention, there is provided a cooling structure for cooling an exothermic panel such as a plasma display panel by releasing heat therefrom, comprising: a chassis structure for holding the exothermic panel; a plurality of circuit board connecting portions, a plurality of heat radiating fins and a plurality of side frames, which are all integrally formed with the chassis structure on one side thereof. Specifically, at least one sort of the circuit board connecting portions, the heat radiating fins and the side frames are formed in a hollow structure.

In one aspect of the present invention, the circuit board connecting portions, the heat radiating fins and the side frames are formed as protruding in one direction perpendicular to the chassis structure.

In another aspect of the present invention, there is provided a display apparatus comprising: a plasma display panel; a circuit board mounting a driving circuit for driving the plasma display panel; and a chassis structure for combining with the plasma display panel on one side thereof and for mounting the circuit board on the other. Specifically, the chassis structure includes on said other side thereof a plurality of circuit board connecting portions, a plurality of heat radiating fins and a plurality of side frames. In particular, the circuit board connecting portions, the heat radiating fins and the side frames are integrally formed with the chassis structure and at least one sort of them are formed in a hollow structure.

In a further aspect of the present invention, the one side of the chassis structure is flat over the entire surface thereof, so as to be easily combinable with the plasma display panel.

In a still further aspect of the present invention, each of the circuit board connecting portions includes an elongated air passage, the heat radiating fins are connected with elongated air passages, each of the side frames includes an elongated air passage.

The above objects and features of the present invention will become better understood from the following description with reference to the accompanying drawings.

DETAILED DESCRIPTION OF THE PREFERRED EMBODIMENTS

An embodiment of the present invention will be described in the following with reference to the accompanying drawing.

Figure 1:
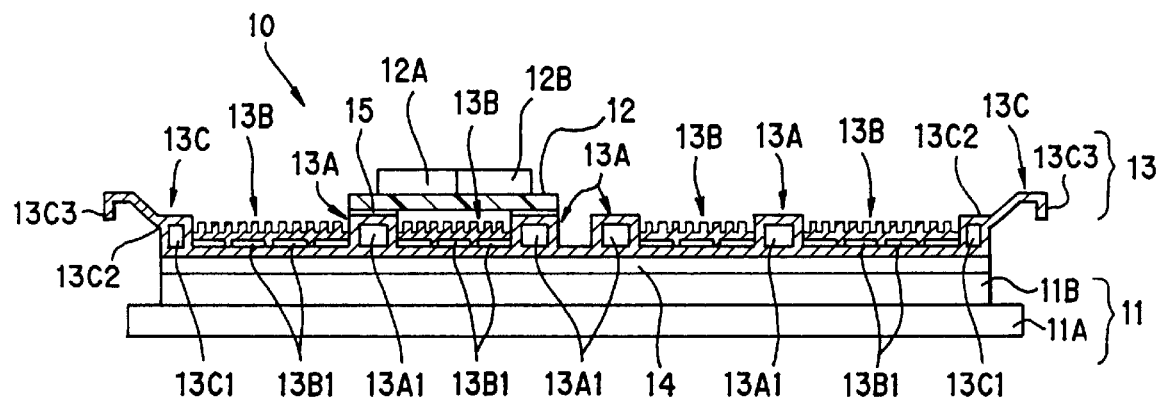
FIG. 1 is a sectional view showing a plasma display apparatus containing a cooling structure formed according to the present invention.
Figure 2:
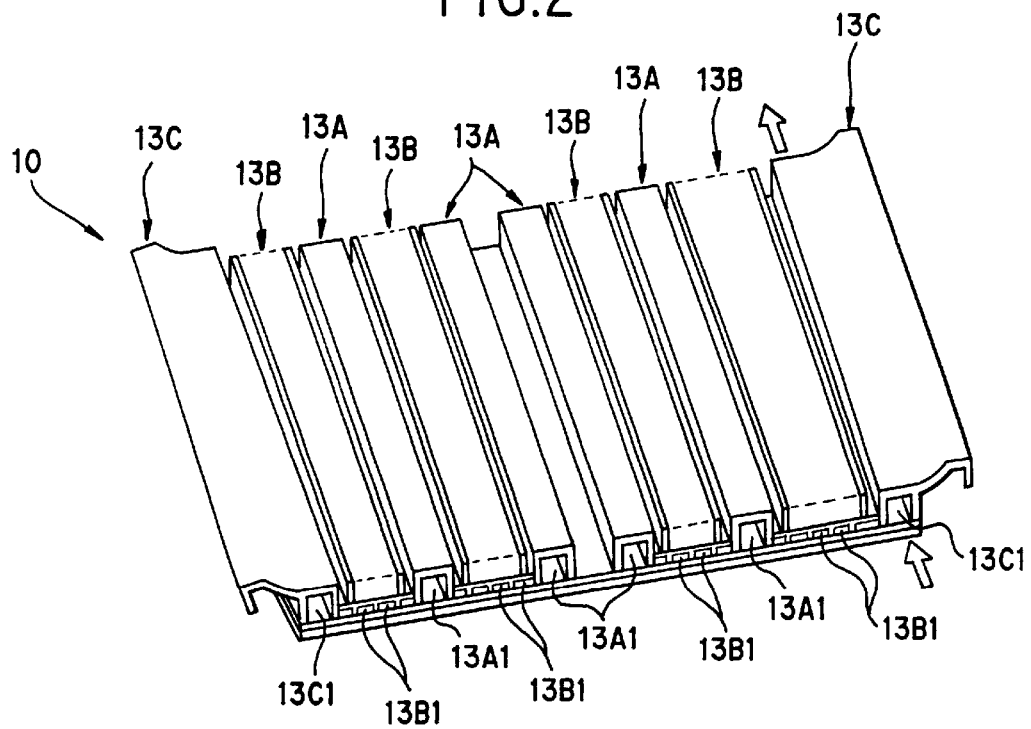
FIG. 2 is a perspective view showing the plasma display apparatus of FIG. 1.
Figure 3:
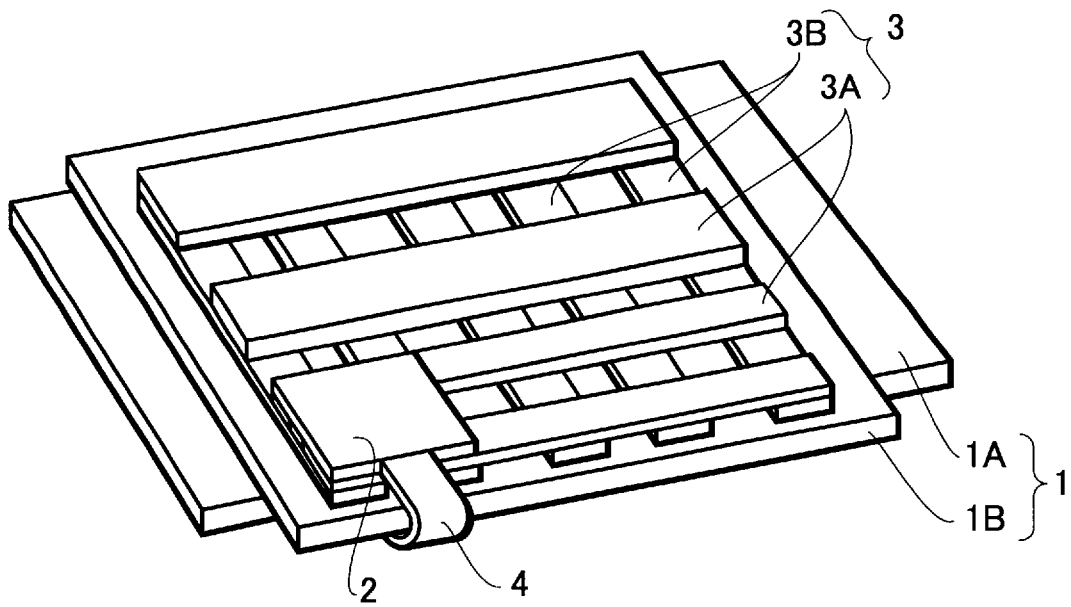
FIG. 3 is a perspective view showing one example of a conventional plasma display apparatus.
Figure 4:
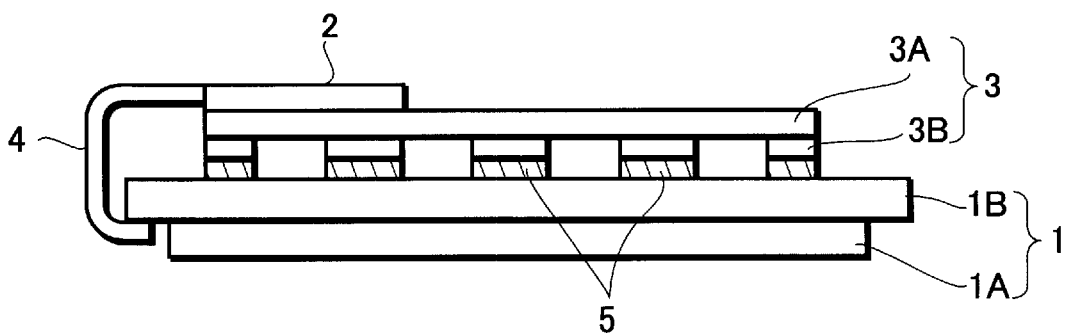
FIG. 4 is a side view showing the conventional plasma display apparatus of FIG. 3.

Referring to FIG. 1, a plasma display apparatus 10 formed according to the present invention comprises a plasma display panel (hereinafter simply referred to as PDP) 11, a circuit board 12 mounting a power source circuit and a driving circuit 12B for driving the the PDP 11, a chassis structure 13 for holding the PDP 11 and the circuit board 12.

Here, the PDP 11 comprises a front glass plate 11A and a rear glass plate 11B, which are bonded together with a small electric discharge space formed therebetween.

In practice, the chassis 13 is a sash structure formed by extrusion-molding a metal material such as aluminium having a high coefficient of thermal conductivity. One side of the chassis 13 is formed into a flat surface, the other side thereof is provided with circuit board attaching portions 13A, heat radiating fins 13B, and side frames 13C for attaching the chassis 13 to a rear case (not shown) of a video equipment (not shown).

Here, the circuit board attaching portions 13A, the heat radiating fins 13B and the side frames 13C are integrally formed on one side of the chassis 13.

As shown in FIG. 1, the circuit board attaching portions 13A, the heat radiating fins 13B and the side frames 13C are all formed in a hollow structure.

In particular, the circuit board attaching portions 13A are rectangular projections protruding in a direction perpendicular to the main surface of the chassis 13. Each of the circuit board attaching portions 13A has an elongated air passage 13A1. The heat radiating fins 13B are provided between the circuit board attaching portions 13A and the side frames 13C, by virtue of several beam members formed between the portions 13A and the frames 13C. Specifically, the heat radiating fins 13B are located at a level higher than the bottoms of the circuit board attaching portions 13A. Further, under the bottoms of the heat radiating fins 13B there are formed a plurality of elongated air passages 13B1, thereby forming the desired hollow structure.

Each side frame 13C has a rectangular parallelepiped portion 13C2 including an elongate air passage 13C1, in a manner such that the rectangular parallelepiped portion 13C2 is integrally formed with an outermost heat radiating fin 13B. Further, each side frame 13C has an engaging edge 13C3.

In the present embodiment, the PDP 11 is completely bonded onto one side of the chassis 13 by means of a pressure sensitive adhesive double coated tape 14.

The circuit board 12 is then combined to the circuit board attaching portions 13A by means of solderring, using a copper foil 15 having a good thermal conductivity which also serves as ground terminal.

On the other hand, it is also possible for the chassis 13 to be bonded to the PDP 11, also using the pressure sensitive adhesive double coated tape 14.

In this manner, since the chassis 13 has been formed with the elongated air passages 13A1, 13B1 and 13C1 which are effective for providing increased areas for contacting the outside air, the outside air is allowed to easily pass therethrough, thereby effecting a desired heat radiation.

In this way, when heat is transferred from both the PDP 11 and the circuit board 12, such heat is allowed to contact the outside air which are flowing through the elongated air passages 13A1, 13B1 and 13C1, thereby effectively removing the heat therefrom. At this time, the elongated air passages 13A1, 13B1 and 13C1 are preferred to be arranged along the heat rising direction, thereby ensuring a high efficiency for heat radiation.

Therefore, since the circuit board attaching portions 13A, the heat radiating fins 13B and the side frames 13C are all directly connected with the chassis 13, an efficient heat transfer structure is thus formed between the circuit board attaching portions 13A, the heat radiating fins 13B, and the side frames 13C on one side and the chassis 13 on the other. Further, since the side frames 13C are connected with a rear case (not shown) of a video equipment (not shown), the heat transferred from the PDP 11 to the chassis 13 is allowed to further transfer to the rear case, thereby forming a further heat radiation structure in addition to the heat radiation through the elongated air passages 13A1, 13B1 and 13C1.

Referring again to FIG. 1, since one side of the chassis 13 is flat and combined with the PDP 11 through the pressure sensitive adhesive double coated tape 14, the non-display areas (non-luminescent area, including the edge portions thereof) located on the outside of the display area (luminescent area) of the PDP 11 can all become heat transfer areas. Further, since the chassis 13 and the PDP 11 are combined together by the pressure sensitive adhesive double coated tape 14, there are not any adherence irregularities, thus ensuring a uniform heat transfer. In this way, the heat from almost the entire area of the PDP 11 can be efficiently transferred to the chassis 13 through the pressure sensitive adhesive double coated tape 14, ensuring a uniform temperature distribution over the PDP 11. As a result, it is possible to alleviate a thermal stress on the PDP 11.

In the above embodiment, although it has been described that the circuit board attaching portions 13A, the heat radiating fins 13B and the side frames 13C are integrally formed together, it is also possible that they may be at first formed individually and then connected together by means of screws or posts.

In addition, if air supplying fans are provided adjacent to inlets and/or outlets of the elongated air passages 13A1, it is allowed to obtain a further improved heat radiation.

As may be understood from the above description, with the use of the present invention, it is allowed to obtain at least the following effects.

Firstly, since at least one sort of the circuit board connecting portions, the heat radiating fins and the side frames are formed in a hollow structure, the heat transmitted from the exothermic panel such as plasma display panel is allowed to more easily contact the outside air, thereby enhancing a desired heat radiation and thus achieving an efficient cooling of the exothermic panel. In addition, the hollow structure makes it possible to reduce the total weight of the plasma display apparatus.

Secondly, since a plurality of circuit board connecting portions, a plurality of heat radiating fins and a plurality of side frames are all integrally formed with the chassis structure on one side thereof, it is possible to make easier an operation for assembling the plasma display apparatus.

Thirdly, since one side of the chassis structure is made flat over the entire surface thereof, the chassis structure is more easily combinable with the plasma display panel, thereby avoiding any adhesion irregularities and thus maximizing an effective heat transfer area.

While the presently preferred embodiments of the this invention have been shown and described above, it is to be understood that these disclosures are for the purpose of illustration and that various changes and modifications may be made without departing from the scope of the invention as set forth in the appended claims.

What is claimed is:

1. A cooling structure for cooling an exothermic panel such as a plasma display panel by releasing heat therefrom, comprising:

a chassis structure for holding the exothermic panel;

a plurality of circuit board connecting portions, a plurality of heat radiating fins and a plurality of side frames, integrally formed with the chassis structure on a first side thereof;

wherein at least one of the circuit board connecting portions, the heat radiating fins and the side frames is a hollow structure.

2. A cooling structure according to claim 1, wherein the circuit board connecting portions, the heat radiating fins and the side frames protrude in a direction perpendicular to the chassis structure.

3. A display apparatus comprising:

a plasma display panel;

a circuit board mounting a driving circuit for driving the plasma display panel; and a chassis structure for combining with the plasma display panel on a first side thereof and for mounting the circuit board on a second side;

wherein the chassis structure includes on said second side thereof a plurality of circuit board connecting portions, a plurality of heat radiating fins and a plurality of side frames;

wherein the circuit board connecting portions, the heat radiating fins and the side frames are integrally formed with the chassis structure and at least one of the circuit board connecting portions, the heat radiating fins and the side frames is a hollow structure.

4. A display apparatus according to claim 3, wherein said first side of the chassis structure is flat over the entire surface thereof, so as to be easily combined with the plasma display panel.

5. A display apparatus according to claim 3, wherein each of the circuit board connecting portions includes an elongated air passage.

6. A display apparatus according to claim 3, wherein the heat radiating fins are connected with elongated air passages.

7. A display apparatus according to claim 3, wherein each of the side frames includes an elongated air passage.

* * * * *